US011915995B2

(12) United States Patent
Fukuchi

(10) Patent No.: US 11,915,995 B2
(45) Date of Patent: Feb. 27, 2024

(54) POWER CONVERTER

(71) Applicant: FUJI ELECTRIC CO., LTD., Kawasaki (JP)

(72) Inventor: Shun Fukuchi, Suzuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 10 days.

(21) Appl. No.: 17/677,357

(22) Filed: Feb. 22, 2022

(65) Prior Publication Data

US 2022/0181233 A1 Jun. 9, 2022

Related U.S. Application Data

(63) Continuation of application No. PCT/JP2021/003970, filed on Feb. 3, 2021.

(30) Foreign Application Priority Data

Mar. 19, 2020 (JP) ................. 2020-049233

(51) Int. Cl.
  *H01L 23/40* (2006.01)
  *H05K 1/02* (2006.01)
  *H05K 7/20* (2006.01)

(52) U.S. Cl.
  CPC .......... *H01L 23/40* (2013.01); *H05K 1/0212* (2013.01); *H05K 7/20927* (2013.01); *H05K 2201/10227* (2013.01)

(58) Field of Classification Search
  CPC ...... H05K 7/00; H05K 7/1422; H05K 7/2039; H05K 7/2049; H05K 7/20409–20418; H05K 7/20154; H05K 7/20509; H05K 7/209; H05K 7/20927; H05K 7/20272; H05K 7/20772; H05K 7/20872; H01L 23/367; H01L 23/3677; H01L 23/40–4006; H01L 23/4093; H01L 23/4081; H01L 23/4087; H01L 23/405;
  (Continued)

(56) References Cited

U.S. PATENT DOCUMENTS 4,972,294 A * 11/1990 Moses, Jr. ........... H01L 23/4093
  174/16.3
5,225,965 A * 7/1993 Bailey ................. H01L 23/4093
  174/16.3

(Continued)

FOREIGN PATENT DOCUMENTS

CN  110463370 A  11/2019
JP  H07-014695 U  3/1995
(Continued)

OTHER PUBLICATIONS

WO-2004086501-A1 English Translation (Year: 2004).*
(Continued)

*Primary Examiner* — Amir A Jalali
(74) *Attorney, Agent, or Firm* — Manabu Kanesaka

(57) ABSTRACT

A power converter includes a housing including a convex radiator that radiates heat from a heater element and protrudes toward a board, in which the board and the heater element are arranged, and an urging member that is arranged between the board and a bottom surface of the housing and urges the heater element toward a first side surface of the convex radiator of the housing.

11 Claims, 5 Drawing Sheets

(58) Field of Classification Search
CPC ....... H01L 23/46; H01L 23/50; H01L 23/473; H01L 23/3436–3675; G06F 1/20; G06F 1/203
See application file for complete search history.

(56) References Cited

U.S. PATENT DOCUMENTS

| | | | | |
|---|---|---|---|---|
| 5,309,979 | A * | 5/1994 | Brauer | H01L 23/4093 174/16.3 |
| 5,321,582 | A * | 6/1994 | Casperson | H05K 7/2049 361/705 |
| 6,266,244 | B1 * | 7/2001 | Guthrie | H01L 23/40 257/713 |
| 6,714,414 | B1 * | 3/2004 | Dubovsky | H01L 23/4006 257/722 |
| 11,558,967 | B2 * | 1/2023 | Ookado | H05K 1/0203 |
| 2003/0047304 | A1 | 3/2003 | Kasuga | |
| 2005/0264998 | A1 * | 12/2005 | McCutcheon | H01L 23/4006 257/E23.084 |
| 2008/0278918 | A1 * | 11/2008 | Tominaga | B62D 5/0406 361/719 |
| 2011/0304039 | A1 * | 12/2011 | Miyamoto | H01L 23/473 257/E23.08 |
| 2018/0343775 | A1 * | 11/2018 | Huang | H01L 23/4093 |
| 2019/0208672 | A1 | 7/2019 | Yamabe et al. | |
| 2020/0120830 | A1 | 4/2020 | Song | |

FOREIGN PATENT DOCUMENTS

| | | | | |
|---|---|---|---|---|
| JP | 2000-349233 A | | 12/2000 | |
| WO | WO-2004086501 A1 * | | 10/2004 | H01L 23/4006 |
| WO | 2018/055668 A1 | | 3/2018 | |

OTHER PUBLICATIONS

PCT/ISA/210, "International Search Report for International Application No. PCT/JP2021/003970," dated Apr. 27, 2021.
PCT/ISA/237, "Written Opinion by the International Search Authority for International Application No. PCT/JP2021/003970," dated Apr. 27, 2021.

* cited by examiner

POWER CONVERTER

CROSS-REFERENCE TO RELATED APPLICATION

This application is a continuation of PCT application PCT/JP2021/003970, filed on Feb. 3, 2021.

BACKGROUND OF THE INVENTION

Field of the Invention

The present invention relates to a power converter, and more particularly, it relates to a power converter including a board and a heater element that is connected to the board and performs power conversion.

Description of the Background Art

A power converter including a board and a heater element that is connected to the board and performs power conversion is known in general. Such a power converter is disclosed in Japanese Utility Model Laid-Open No. 7-014695.

Japanese Utility Model Laid-Open No. 7-014695 discloses an AC power supply adapter (power converter) including a printed circuit board (board) and a rectifying diode (heater element) that is connected to the printed circuit board and performs power conversion. The AC power supply adapter includes a radiator plate, a holding metal fitting, and an adapter case. The printed circuit board, the rectifying diode, the radiator plate, and the holding metal fitting are housed inside the adapter case.

The radiator plate disclosed in Japanese Utility Model Laid-Open No. 7-014695 is made of metal such as aluminum, which has high heat conductivity. The radiator plate is fixed to the printed circuit board. The holding metal fitting is fixed to the radiator plate and urges the rectifying diode while being fixed to the radiator plate. Thus, the radiator plate and the rectifying diode are brought into close contact with each other.

However, in the AC power supply adapter disclosed in Japanese Utility Model Laid-Open No. 7-014695, a dedicated radiator plate for cooling the rectifying diode is provided separately from the adapter case. Thus, in the AC power supply adapter disclosed in Japanese Utility Model Laid-Open No. 7-014695, the number of components of the AC power supply adapter (power converter) disadvantageously increases, and the size of the AC power supply adapter (power converter) disadvantageously increases.

SUMMARY OF THE INVENTION

The present invention has been proposed in order to solve the aforementioned problems, and an object of the present invention is to provide a power converter capable of significantly reducing or preventing an increase in the number of components in the power converter and significantly reducing or preventing an increase in the size of the power converter.

A power converter according to an aspect of the present invention includes a board, a heater element that is connected to the board and performs power conversion, a housing including a convex radiator that radiates heat from the heater element and protrudes toward the board, in which the board and the heater element are arranged, and an urging member that is arranged between the board and a bottom surface of the housing and urges the heater element toward a first side surface of the convex radiator of the housing, and the urging member is fixed to the housing by fastening a first fastening member in a fastening direction along a direction opposite to a protruding direction of the convex radiator.

As described above, the power converter according to this aspect of the present invention includes the housing including the convex radiator that radiates heat from the heater element and protrudes toward the board, in which the board and the heater element are arranged, and the urging member that is arranged between the board and the bottom surface of the housing and urges the heater element toward the first side surface of the convex radiator of the housing. Accordingly, the housing includes the convex radiator to radiate heat from the heater element (the housing also serves as the convex radiator), and thus unlike a case in which a dedicated radiator is provided separately from the housing to radiate heat from the heater element, an increase in the number of components of the power converter and an increase in the size of the power converter can be significantly reduced or prevented.

In the aforementioned power converter according to this aspect, the housing preferably further includes a fixing portion to which the urging member is fixed, and the board preferably includes a notch or an opening that exposes the fixing portion as viewed in the protruding direction of the convex radiator. With this configuration, the board includes the notch or the opening such that even when the board is fixed to the housing, the urging member can be fixed to the fixing portion of the housing through the notch or the opening. Thus, the workability at the time of fixing the urging member to the fixing portion of the housing can be improved.

In this case, the fixing portion preferably includes a convex mount that protrudes from the bottom surface of the housing toward the board, and an end face of the convex mount in the protruding direction is preferably arranged on the bottom surface side of the housing relative to an end face of the convex radiator in the protruding direction. With this configuration, the convex mount is provided on the fixing portion to which the urging member is fixed, and the end face of the convex mount in the protruding direction is arranged on the bottom surface side of the housing relative to the end face of the convex radiator in the protruding direction such that a fixing member for fixing the urging member to the convex mount can be arranged on the bottom surface side of the housing. Consequently, the fixing member can be prevented from interfering with a cover of the housing, and thus the airtightness of the housing can be ensured.

The aforementioned power converter according to this aspect preferably further includes a cooling water flow path through which cooling water flows to cool a second side surface of the convex radiator on a side opposite to the first side surface. With this configuration, the second side surface can be effectively cooled as compared with a case in which the second side surface is cooled by air, and thus the cooling performance of the power converter can be improved.

The aforementioned power converter according to this aspect preferably further includes a housing recess surrounded by the first side surface of the convex radiator, an inner side surface of the housing that faces the first side surface, and a portion of the bottom surface of the housing between the first side surface and the inner side surface of the housing, and the urging member is preferably fixedly housed in the housing while being arranged in the housing recess. With this configuration, the urging member is inserted into the housing recess and fixed to the housing while being arranged in the housing recess such that the urging member can be fixed at a desired position in the housing recess. Thus, the workability at the time of fixing the urging member to the housing can be improved.

In this case, the inner side surface of the housing in the housing recess preferably includes a guide that guides the urging member when the urging member is inserted into the housing recess. With this configuration, the urging member can be easily arranged at the desired position in the housing recess due to the guide, and thus the workability at the time of fixing the urging member to the housing can be further improved.

In the aforementioned power converter according to this aspect, the urging member preferably includes a base that extends along a direction opposite to an urging direction of the urging member, and an urging portion that protrudes from the base along the protruding direction of the convex radiator, the board is preferably fixed to the housing by fastening a second fastening member in the fastening direction, and the urging member is preferably fixed to the housing via the base by fastening the first fastening member in the fastening direction. With this configuration, the fastening direction of the second fastening member for fastening the board to the housing and the fastening direction of the first fastening member for fastening the urging member to the housing are the same as each other, and thus the board and the urging member can be fixed to the housing by the fastening members while the orientation of the power converter is not changed with maintaining the same orientation. Consequently, the workability at the time of fixing the board and the urging member to the housing can be improved.

In this case, the heater element includes a plurality of heating elements preferably arranged side by side on the board, and the urging portion includes a plurality of urge-portions preferably provided so as to correspond to arrangement positions of the plurality of heating elements, spaced apart from each other, and provided integrally with the base. With this configuration, unlike a case in which the plurality of heating elements is urged by urge-portions continuously extending in a direction in which the plurality of heating elements is aligned, the plurality of heating elements can be individually urged by the corresponding urge-portions, and thus each of the plurality of heating elements can be reliably urged toward the first side surface. Furthermore, the plurality of urge-portions is provided integrally with the base such that as compared with a case in which the plurality of urge-portions is separately fastened to the housing, the workability at the time of fixing the urging member to the housing can be further improved.

In the aforementioned power converter including the urging member that includes the urging portion, the urging portion preferably has a tapered shape in which a width of the urging portion in a width direction orthogonal to the protruding direction of the convex radiator and a direction in which the first side surface and an inner side surface of the housing face each other decreases in the protruding direction of the convex radiator. With this configuration, a contact area between the urging portion and the heater element can be decreased, and thus the load received by the urging portion from the heater element can be decreased. Consequently, a bending stress generated in the urging portion can be decreased, and thus the urging member can be prevented from being plastically deformed by the load received from the heater element.

The aforementioned power converter according to this aspect preferably further includes a flexible heat conduction sheet arranged between the first side surface and the heater element, and the heater element is preferably pressed by the urging member against the first side surface of the convex radiator via the heat conduction sheet. With this configuration, even when a gap between the first side surface and the heater element differs depending on the power converter due to a manufacturing error (tolerance), the first side surface and the heater element can be brought into contact with each other without a gap via the flexible heat conduction sheet. That is, the heater element is pressed by the urging member against the flexible heat conduction sheet such that the heater element can be brought into contact with the heat conduction sheet without a gap. Furthermore, the flexible heat conduction sheet can be pressed against the first side surface by the urging member via the heater element, and thus the first side surface can be brought into contact with the heat conduction sheet without a gap. Consequently, the heat conduction sheet is used such that it becomes difficult for an air layer to be formed between the heater element and the first side surface, and thus heat generated in the heater element can be efficiently radiated to the first side surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment embodying the present invention is hereinafter described on the basis of the drawings.

The configuration of a power converter 100 according to this embodiment is now described with reference to FIGS. 1 to 7.

Figure 1:
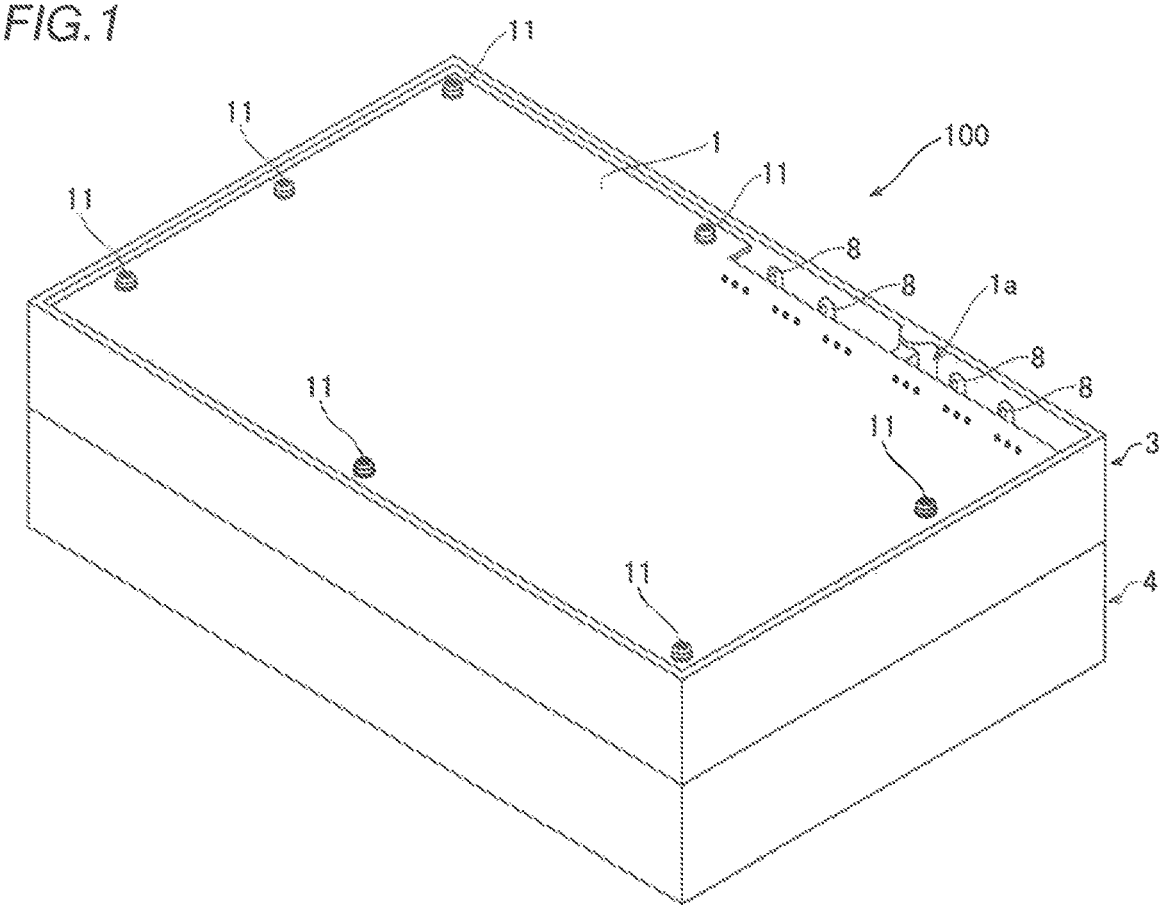
FIG. 1 is a perspective view showing a power converter with a cover being removed according to this embodiment.
Figure 2:
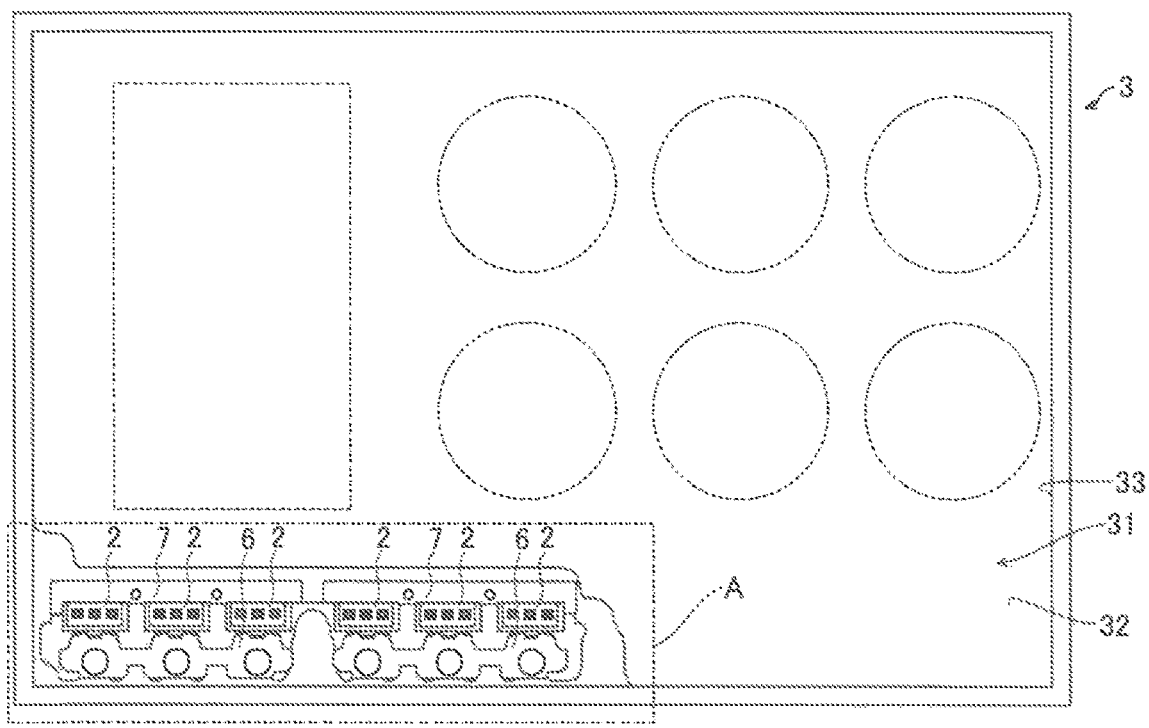
FIG. 2 is a plan view showing the power converter with the cover and a board being removed according to this embodiment, as viewed from the Z1 direction side.

As shown in FIGS. 1 and 2, the power converter 100 is an inverter device installed in an electric vehicle. The power converter 100 includes a board 1, heater elements 2, a first housing 3, a second housing 4, a cooling water flow path 5 (see FIG. 4), urging members 6, heat conduction sheets 7, and guide protrusions 8. The electric vehicle refers to a vehicle such as an electric car equipped with a high-voltage battery. The first housing 3 is an example of a "housing" in the claims. The guide protrusions 8 are examples of a "guide" in the claims.

The board 1 is a printed circuit board. The heater elements 2 are electrically connected to the board 1. The board 1 is fixed to the first housing 3 by fastening members 11. The heater elements 2 are electronic components to perform power conversion. That is, the heater elements 2 are electronic components used in a power conversion control unit that converts DC power into AC power. Specifically, the heater elements 2 are semiconductor devices such as insulated gate bipolar transistors (IGBTs) or freewheeling diodes. The fastening members 11 are examples of a "second fastening member" in the claims.

The first housing 3 is made of metal such as aluminum. The first housing 3 has a substantially rectangular parallelepiped shape (substantially box shape). The first housing 3 is provided with an internal space 31. The first housing 3 includes a bottom surface 32. The first housing 3 includes an opening 33 on the side opposite to the bottom surface 32. The first housing 3 includes a cover 9 (see FIG. 4) that closes the opening 33 of the first housing 3. The board 1 and the heater elements 2 are arranged inside the first housing 3. The cover 9 is provided integrally with the first housing 3, and is a portion of the first housing 3.

Figure 3:
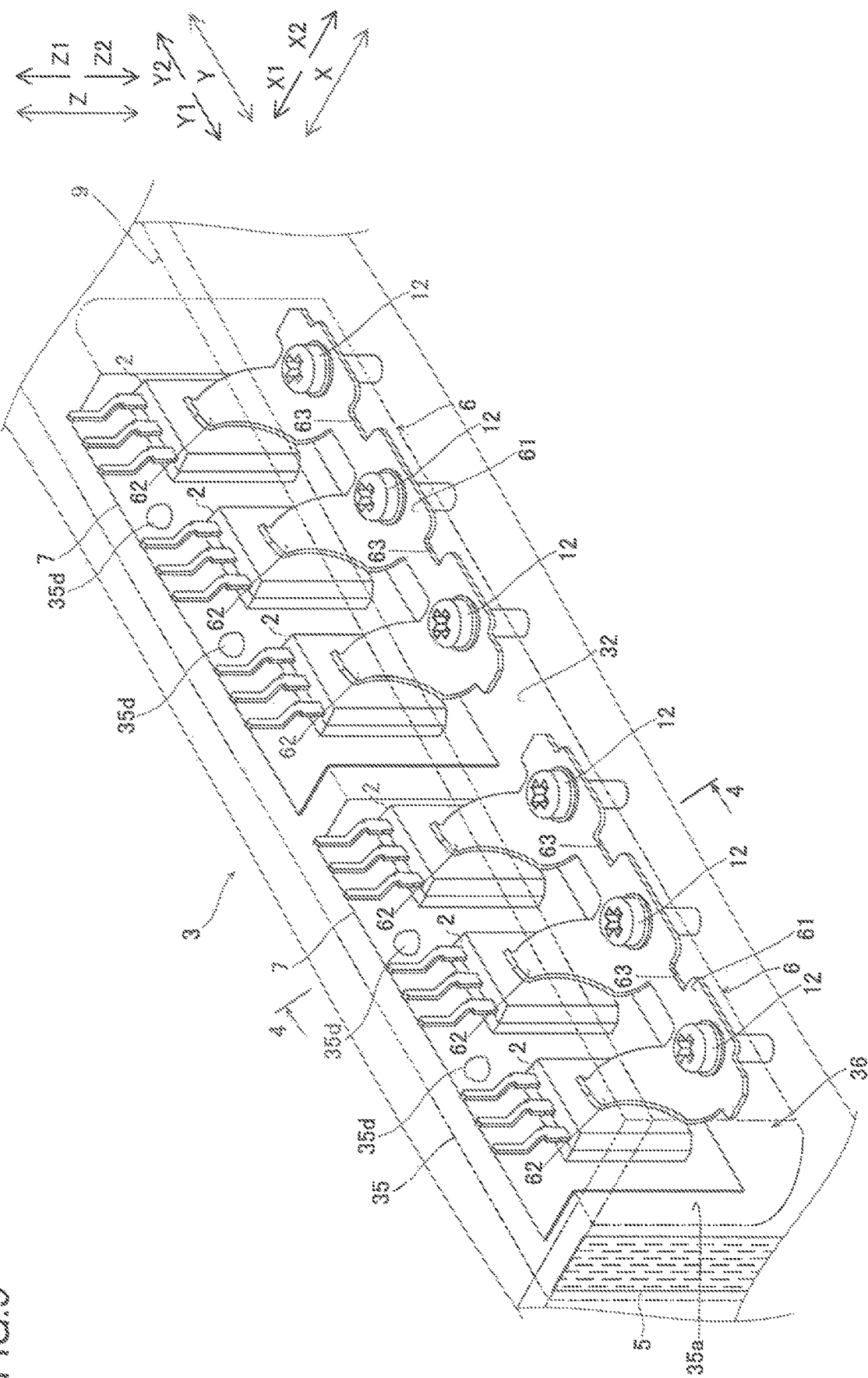
FIG. 3 is an enlarged perspective view of a portion A in FIG. 2.
Figure 4:
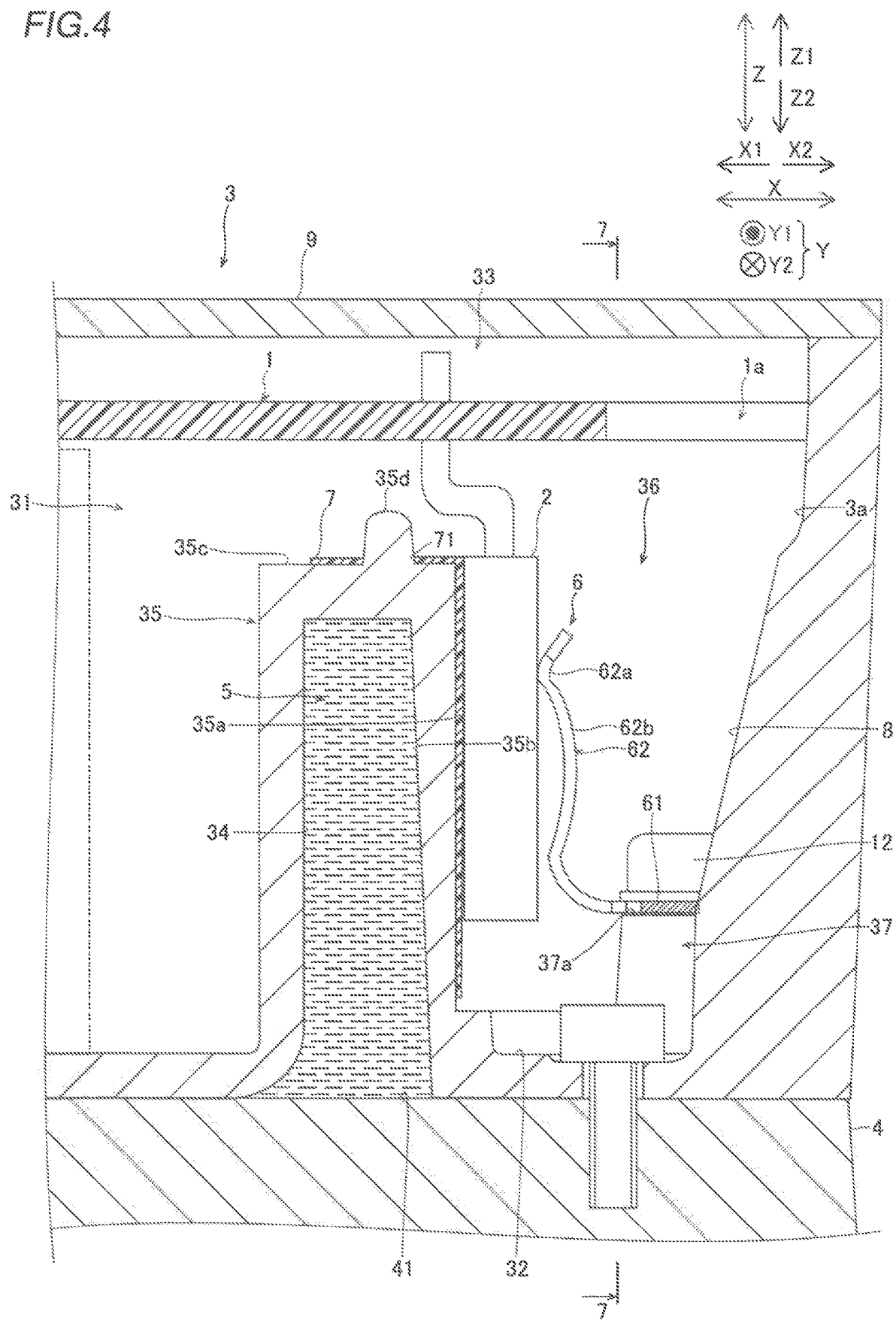
FIG. 4 is a sectional view taken along the line 4-4 in FIG. 3.

As shown in FIGS. 3 and 4, the board 1 is arranged at a position that faces the bottom surface 32 of the first housing 3. The second housing 4 has the same configuration as the first housing 3, and thus illustration and description thereof are omitted.

In the following description, a direction in which the board 1 and the bottom surface 32 of the first housing 3 face each other is defined as a Z direction, a direction from the bottom surface 32 of the first housing 3 toward the board 1 in the Z direction is defined as a Z1 direction, and a direction from the board 1 toward the bottom surface 32 of the first housing 3 in the Z direction is defined as a Z2 direction. The urging directions of the urging members 6 are defined as an X1 direction, a direction opposite to the X1 direction is defined as an X2 direction, and a direction in which the X1 direction and the X2 direction are combined is defined as an X direction. A direction orthogonal to the X and Z directions is defined as a Y direction, one direction in the Y direction is defined as a Y1 direction, and the other direction in the Y direction is defined as a Y2 direction. The Z2 direction is an example of a "fastening direction along a direction opposite to the protruding direction of the convex radiator" in the claims.

The cooling water flow path 5 is a flow path through which cooling water for cooling the heater elements 2 arranged inside the first housing 3 flows. That is, the power converter 100 is a water-cooled device that cools the heater elements 2 with cooling water. The cooling water flow path 5 is defined by a space between the outer surface 34 of the first housing 3 on the Z2 direction side and the outer surface 41 of the second housing 4 on the Z1 direction side. Although not shown, the cooling water flow path 5 is provided with an inflow port into which the cooling water circulating in the electric vehicle flows and an outflow port through which the cooling water heated when the heater elements 2 are cooled flows out. The heated cooling water is cooled by a radiator (not shown).

The cooling water flow path 5 is configured to cool the heater elements 2 arranged in the first housing 3 while the heater elements 2 stand upright in the Z2 direction (a direction orthogonal to the front surface of the board 1). A plurality of (six) heater elements 2 standing upright in the Z2 direction is arranged side by side in the Y direction on the board 1. The cooling water flow path 5 passes on the rear sides of the heater elements 2 standing upright in the Z2 direction in the first housing 3. That is, the first housing 3 includes a convex radiator 35 that radiates heat from the heater elements 2 and protrudes toward the board 1. The number of heater elements 2 may be one or more and five or less, or seven or more.

The convex radiator 35 protrudes in the Z1 direction from the bottom surface 32 of the first housing 3. The convex radiator 35 is hollow (has a space inside). A space surrounded by the inner surface of the convex radiator 35 on the hollow side and the outer surface 41 of the second housing 4 on the Z1 direction side is the cooling water flow path 5 through which cooling water flows to cool the heater elements 2 standing upright in the X2 direction in the first housing 3.

The convex radiator 35 includes a first side surface 35a as a heat radiating surface and a second side surface 35b as a cooling surface. The first side surface 35a is a side surface to which the heat of the heater elements 2 is transferred. The first side surface 35a is an outer surface of the convex radiator 35 on the X2 direction side. The second side surface 35b is a side surface with which cooling water for cooling the heated first side surface 35a comes into contact. The second side surface 35b is an inner side surface of the convex radiator 35 on the X2 direction side. That is, the second side surface 35b is a side surface on the X1 direction side (opposite side) of the first side surface 35a.

Thus, the cooling water flows through the cooling water flow path 5 to cool the second side surface 35b on the side opposite to the first side surface 35a of the convex radiator 35.

Urging Members

As shown in FIG. 4, the urging members 6 according to this embodiment are configured to press the heater elements 2 in order to bring the heater elements 2 into close contact with the heat conduction sheets 7. That is, the urging members 6 are arranged between the board 1 and the bottom surface 32 of the first housing 3, and urges the heater elements 2 toward the first side surface 35a of the convex radiator 35 of the first housing 3 (toward the X1 direction side). The urging members 6 are leaf springs made of metal such as stainless steel.

The urging members 6 are housed in a housing recess 36 formed in the first housing 3. The housing recess 36 is formed by recessing a surface of the first housing 3 on the Z1 direction side to the Z2 direction side. The housing recess 36 is surrounded by the first side surface 35a of the convex radiator 35, the inner side surface 3a of the first housing 3 facing the first side surface 35a, and a portion of the bottom surface 32 of the first housing 3 between the first side surface 35a and the inner side surface 3a of the first housing 3.

The urging members 6 are fixedly housed in the first housing 3 while being arranged in the housing recess 36. That is, the urging members 6 are fixed to the first housing 3 by fastening members 12 in the housing recess 36. The first housing 3 includes a convex mount 37 to which the urging members 6 are fixed. The convex mount 37 includes female threaded portions into which the fastening members 12 are screwed. The convex mount 37 protrudes in the Z1 direction (toward the board 1) from the bottom surface 32 of the first housing 3. The convex mount 37 is arranged on the Z2 direction side of the housing recess 36. Specifically, the end face 37a of the convex mount 37 in the Z1 direction (protruding direction) is arranged on the Z2 direction side (bottom surface 32 side) of the housing relative to the end face 35c of the convex radiator 35 in the Z1 direction (protruding direction). The fastening members 12 are examples of a "first fastening member" in the claims. The convex mount 37 is an example of a "fixing portion" in the claims.

Figure 5:
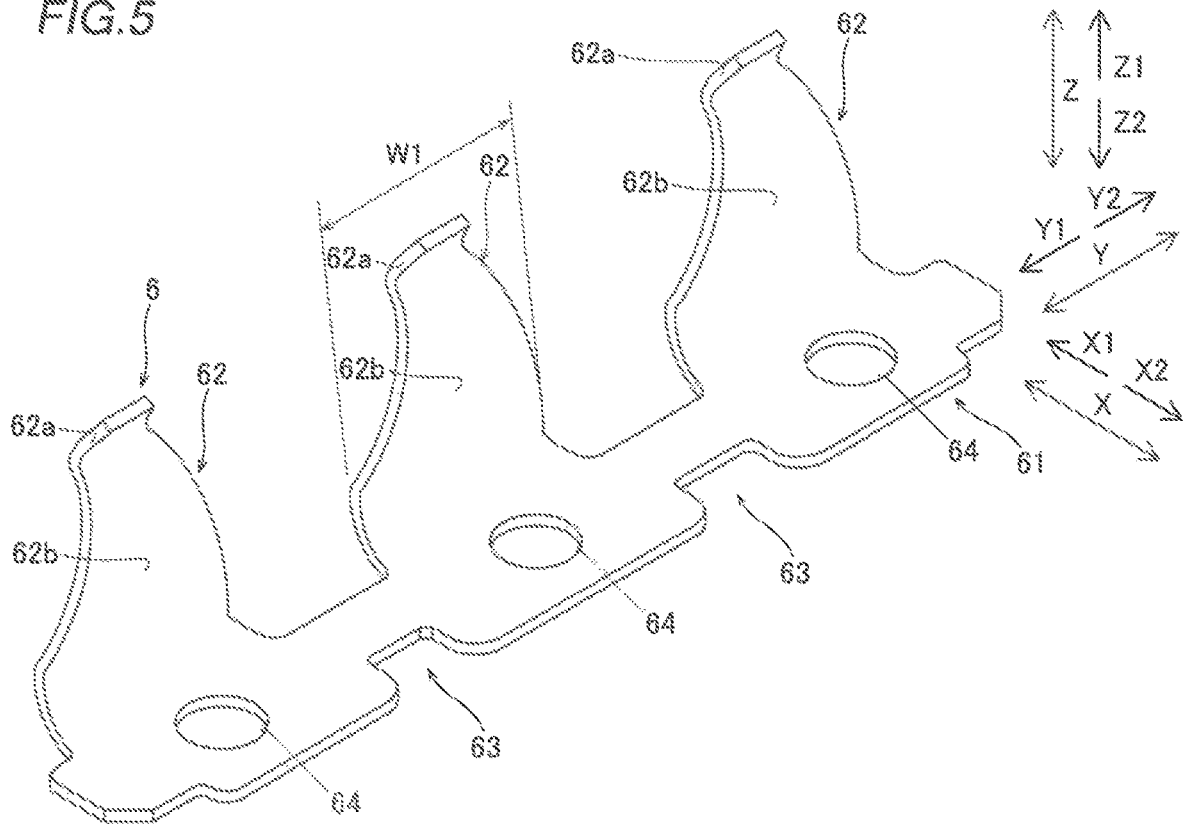
FIG. 5 is a perspective view of an urging member of the power converter according to this embodiment.

Specifically, as shown in FIGS. 4 and 5, each of the urging members 6 includes a base 61, urging portions 62, and guide grooves 63. The urging member 6 has a substantially L-shape due to the base 61 and the urging portion 62 as viewed from the Y1 direction side.

The base 61 extends along the X2 direction. The base 61 includes insertion holes 64 into which the fastening members 12 are inserted. The insertion holes 64 pass through the base 61 in the Z direction. The base 61 is sandwiched between the heads of the fastening members 12 inserted into the insertion holes 64 and the convex mount 37. A plurality of (three) insertion holes 64 is formed in the base 61. The number of insertion holes 64 may be one, two, or four or more instead of three.

The urging member 6 is fixed to the first housing 3 via the base 61 by fastening the fastening members 12 in the Z2 direction (fastening direction). The board 1 is fixed to the first housing 3 by fastening the fastening members 11 in the Z2 direction (fastening direction) (see FIG. 1). Thus, the fastening directions of the fastening members 11 to the board 1 and the fastening directions of the fastening members 11 to the urging member 6 are substantially the same.

The urging member 6 is fixed to the first housing 3 by the fastening members 12 while being arranged in the housing recess 36 after the board 1 is fixed to the first housing 3. Therefore, the board 1 includes a notch 1a that exposes the convex mount 37 as viewed from the Z1 direction side (in the protruding direction of the convex radiator 35). Thus, the fastening members 12 are inserted into the housing recess 36 through the notch 1a of the board 1 and screwed into the convex mount 37.

The urging portions 62 protrude from the base 61 along the Z1 direction (along the protruding direction of the convex radiator 35). Each of the urging portions 62 has a tapered shape in which the width W1 of the urging portion 62 in the Y direction (width direction) decreases in the Z1 direction (the protruding direction of the convex radiator 35).

Protruding tip portions 62a of the urging portions 62 on the Z1 direction side contact surfaces of the heater elements 2 on the X2 direction side. Each of the protruding tip portions 62a of the urging portions 62 has an arcuate shape curved toward the X1 direction side (heater element 2 side). Thus, the protruding tip portions 62a of the urging portions 62 is in line contact with the heater elements 2. Furthermore, each of the protruding tip portions 62a of the urging portions 62 has a rounded shape, and thus it is difficult for the protruding tip portions 62a to bite into surfaces of the heater elements 2 on the X2 direction side. Each of portions 62b of the urging portions 62 on the Z2 direction side relative to the protruding tip portions 62a has an arcuate shape curved toward the X2 direction side (the side opposite to the heater element 2 side). Thus, portions of the urging portions 62 other than the protruding tip portions 62a are prevented from contacting the heater elements 2.

A plurality of (three) urging portions 62 corresponds to the arrangement positions of a plurality of (three) heater elements 2 and is spaced apart from each other. The plurality of (three) urging portions 62 is provided integrally with the base 61. The number of urging portions 62 may be one, two, or four or more instead of three.

The guide grooves 63 are grooves into which the guide protrusions 8 are inserted. The guide grooves 63 are formed by recessing the end of the base 61 on the X2 direction side to the X1 direction side.

Heat Conduction Sheets

The heat conduction sheets 7 are made of thermal interface materials. The heat conduction sheets 7 are flexible members arranged between the first side surface 35a and the heater elements 2. The heat conduction sheets 7 are configured such that no gap is formed between the heater elements 2 and the heat conduction sheets 7. The heat conduction sheets 7 are flexible, and thus it is possible to fill a gap between the heater elements 2 and the heat conduction sheets 7 even when the gap between the heater elements 2 and the heat conduction sheets 7 varies.

The heat conduction sheets 7 are made of materials that easily transfer heat. In addition, the heat conduction sheets 7 are made of materials that insulate the heater elements 2 from the convex radiator 35. Thus, the heater elements 2 are pressed by the urging members 6 against the first side surface 35a of the convex radiator 35 via the heat conduction sheets 7. The heat conduction sheets 7 include engagement holes 71 that are through-hole penetrating in the Z direction. The engagement holes 71 of the heat conduction sheets 7 engage with engagement protrusions 35d formed on the tip end surface of the convex radiator 35.

Guide Protrusions

Figure 6:
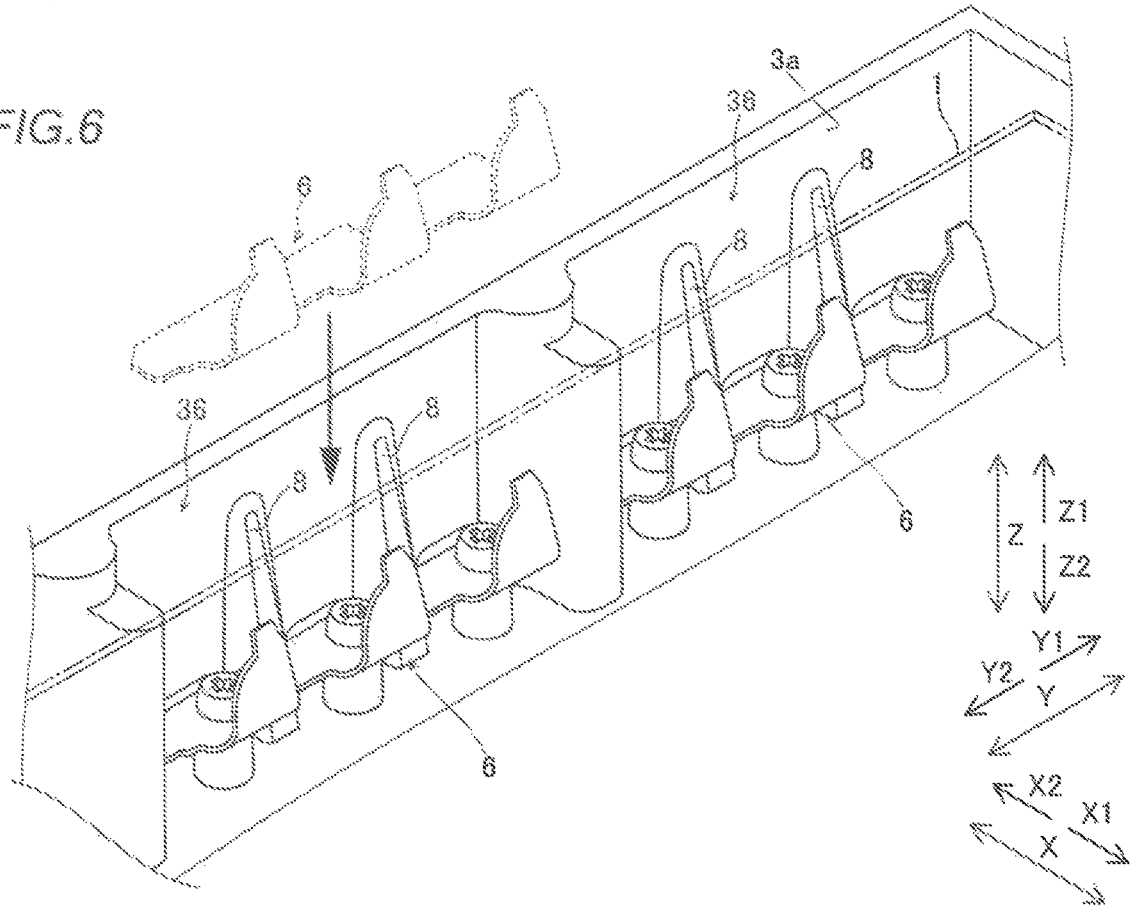
FIG. 6 is a perspective view showing a state in which the urging member is inserted into a housing recess in the power converter according to this embodiment.
Figure 7:
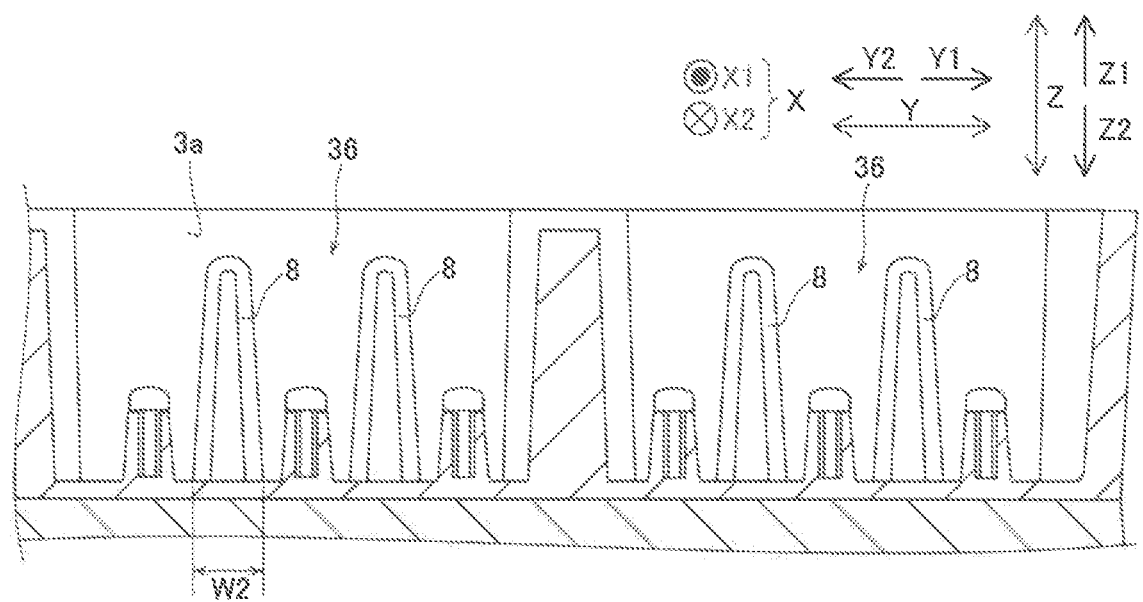
FIG. 7 is a sectional view taken along the line 7-7 in FIG. 4.

As shown in FIGS. 6 and 7, the guide protrusions 8 are configured to guide the urging members 6 when the urging members 6 are inserted into the housing recess 36. The guide protrusions 8 are formed on the inner side surface 3a of the first housing 3 in the housing recess 36. The guide protrusions 8 protrude in the X1 direction from the inner side surface 3a of the first housing 3. Each of the guide protrusions 8 has a tapered shape in which the width W2 of the guide protrusion 8 in the Y direction (width direction) decreases in the Z direction.

Thus, when the urging members 6 are inserted into the housing recess 36 (shown by dotted lines in FIG. 6), the urging members 6 can be arranged in the housing recess 36 (shown by solid lines in FIG. 6) with the misalignment of the urging members 6 being significantly reduced or prevented. That is, when the urging members 6 move in the Z2 direction with the guide protrusions 8 being inserted in the guide grooves 63, the guide protrusions 8 and the guide grooves 63 contact each other such that movement of the urging members 6 in the Y direction is restricted. Therefore, the urging members 6 can be positioned in the Y direction. Furthermore, the urging portions 62 and the heater elements 2 contact each other, and the guide protrusions 8 and the guide grooves 63 contact each other such that movement of the urging members 6 in the X direction is restricted. Therefore, the urging members 6 can be positioned in the X direction.

Advantageous Effects of this Embodiment

According to this embodiment, the following advantageous effects are achieved.

According to this embodiment, as described above, the power converter 100 includes the urging members 6 provided between the board 1 and the bottom surface 32 of the first housing 3 and urging the heater elements 2 toward the first side surface 35a of the convex radiator 35 of the first housing 3. Accordingly, the first housing 3 includes the convex radiator 35 to radiate heat from the heater elements 2 (the first housing 3 also serves as the convex radiator 35), and thus unlike a case in which a dedicated radiator is provided separately from the first housing 3 to radiate heat from the heater elements 2, an increase in the number of components of the power converter 100 and an increase in the size of the power converter 100 can be significantly reduced or prevented.

According to this embodiment, as described above, the board 1 includes the notch 1a that exposes the convex mount 37 as viewed from the Z1 direction side. Accordingly, the board 1 includes the notch 1a such that even when the board 1 is fixed to the first housing 3, the urging members 6 can be fixed to the convex mount 37 of the first housing 3 through the notch 1a, and thus the workability at the time of fixing the urging members 6 to the convex mount 37 of the first housing 3 can be improved.

According to this embodiment, as described above, the end face 37a of the convex mount 37 in the Z1 direction is arranged on the bottom surface 32 side of the first housing 3 relative to the end face 35c of the convex radiator 35 in the Z1 direction. Accordingly, the convex mount 37 to which the urging members 6 are fixed is provided, and the end face 37a of the convex mount 37 on the Z1 direction side is arranged on the bottom surface 32 side of the first housing 3 relative to the end face 35c of the convex radiator 35 on the Z1 direction side such that fixing members for fixing the urging members 6 to the convex mount 37 can be arranged on the bottom surface 32 side of the first housing 3. Consequently, the fixing members can be prevented from interfering with the cover 9 of the first housing 3, and thus the airtightness of the first housing 3 can be ensured.

According to this embodiment, as described above, the power converter 100 includes the cooling water flow path 5 through which the cooling water flows to cool the second side surface 35b of the convex radiator 35 on the side opposite to the first side surface 35a. Accordingly, the second side surface 35b can be effectively cooled as compared with a case in which the second side surface 35b is cooled by air, and thus the cooling performance of the power converter 100 can be improved.

According to this embodiment, as described above, the urging members 6 are fixedly housed in the first housing 3 while being arranged in the housing recess 36. Accordingly, the urging members 6 are inserted into the housing recess 36 and fixed to the first housing 3 while being arranged in the housing recess 36 such that the urging members 6 can be fixed at desired positions in the housing recess 36. Thus, the workability at the time of fixing the urging members 6 to the first housing 3 can be improved.

According to this embodiment, as described above, the inner side surface 3a of the first housing 3 in the housing recess 36 includes the guide protrusions 8 that guide the urging members 6 when the urging members 6 are inserted into the housing recess 36. Accordingly, the urging members 6 can be easily arranged at the desired positions in the housing recess 36 due to the guide protrusions 8, and thus the workability at the time of fixing the urging members 6 to the first housing 3 can be further improved.

According to this embodiment, as described above, the board 1 is fixed to the first housing 3 by fastening the fastening members 11 in the fastening direction along the Z2 direction. Furthermore, the urging members 6 are fixed to the first housing 3 via the base 61 by fastening the fastening members 12 in the fastening direction. Accordingly, the fastening directions of the fastening members 11 for fastening the board 1 to the first housing 3 and the fastening directions of the fastening members 12 for fastening the urging members 6 to the first housing 3 are the same as each other, and thus the board 1 and the urging members 6 can be fixed to the first housing 3 by the fastening members 11 and the fastening members 12 while the orientation of the power converter 100 is not changed with maintaining the same orientation. Consequently, the workability at the time of fixing the board 1 and the urging members 6 to the first housing 3 can be improved.

According to this embodiment, the plurality of heater elements 2 is arranged side by side on the board 1. The plurality of urging portions 62 is provided so as to correspond to the arrangement positions of the plurality of heater elements 2 and is spaced apart from each other. The plurality of urging portions 62 is provided integrally with the base 61. Accordingly, unlike a case in which the plurality of heater elements 2 is urged by the urging portions continuously extending in the Y direction, the plurality of heater elements 2 can be individually urged by the corresponding urging portions 62, and thus each of the plurality of heater elements 2 can be reliably urged toward the first side surface 35a. Furthermore, the plurality of urging portions 62 is provided integrally with the base 61 such that as compared with a case in which the plurality of urging portions 62 is separately fastened to the first housing 3, the workability at the time of fixing the urging members 6 to the first housing 3 can be further improved.

According to this embodiment, as described above, each of the urging portions 62 has a tapered shape in which the width W1 of the urging portion 62 in the Y direction decreases in the Z direction. Accordingly, a contact area between the urging portions 62 and the heater elements 2 can be decreased, and thus the load received by the urging portions 62 from the heater elements 2 can be decreased. Consequently, a bending stress generated in the urging portions 62 can be decreased, and thus the urging members 6 can be prevented from being plastically deformed by the load received from the heater elements 2.

According to this embodiment, as described above, the power converter 100 includes flexible heat conduction sheets 7 arranged between the first side surface 35a and the heater elements 2. The heater elements 2 are pressed by the urging members 6 against the first side surface 35a of the convex radiator 35 via the heat conduction sheets 7. Accordingly, even when a gap between the first side surface 35a and the heater elements 2 differs depending on the power converter 100 due to a manufacturing error (tolerance), the first side surface 35a and the heater elements 2 can be brought into contact with each other without a gap via the flexible heat conduction sheets 7. That is, the heater elements 2 are pressed by the urging members 6 against the flexible heat conduction sheets 7 such that the heater elements 2 can be brought into contact with the heat conduction sheets 7 without a gap. Furthermore, the flexible heat conduction sheets 7 can be pressed against the first side surface 35a by the urging members 6 via the heater elements 2, and thus the first side surface 35a can be brought into contact with the heat conduction sheets 7 without a gap. Consequently, the heat conduction sheets 7 are used such that it becomes difficult for an air layer to be formed between the heater elements 2 and the first side surface 35a, and thus heat generated in the heater elements 2 can be efficiently radiated to the first side surface 35a.

According to this embodiment, as described above, the urging members 6 are fixed to the convex mount 37 provided on the bottom surface 32 different from the first side surface 35a such that unlike a case in which the urging members 6 are fixed to the first side surface 35a, it is possible to prevent the urging members 6 from hindering formation of the cooling water flow path 5 through which the cooling water flows to cool the first side surface 35a heated by the heat radiation of the heater elements 2. Consequently, it is possible to easily form the cooling water flow path 5 through which the cooling water flows smoothly.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the example in which the power converter 100 is a water-cooled device that cools the heater elements 2 with cooling water has been shown in the aforementioned embodiment, the present invention is not restricted to this. In the present invention, the power converter may be an air-cooled device that cools the heater elements with air.

While the example in which the board 1 includes the notch 1a that exposes the convex mount 37 as viewed from the Z1 direction side (in the protruding direction of the convex radiator 35) has been shown in the aforementioned embodiment, the present invention is not restricted to this. In the present invention, the board may include an opening that exposes the convex mount as viewed in the protruding direction of the convex radiator.

While the example in which each of the urging portions 62 has a tapered shape in which the width W1 of the urging portion 62 in the Y direction (width direction) decreases in the Z1 direction (the protruding direction of the convex radiator 35) has been shown in the aforementioned embodiment, the present invention is not restricted to this. In the present invention, each of the urging portions may not have a tapered shape, but the width of each of the urging portions in the width direction may be constant or increase in the protruding direction of the convex radiator.

While the example in which each of the protruding tip portions 62a of the urging portions 62 has an arcuate shape curved toward the X1 direction side (heater elements 2) has been shown in the aforementioned embodiment, the present invention is not restricted to this. In the present invention, each of the protruding tip portions of the urging portions may be formed linearly.

While the example in which each of the portions 62b of the urging portions 62 on the Z2 direction side relative to the protruding tip portions 62a has an arcuate shape curved toward the X2 direction side (the side opposite to the heater element 2 side) has been shown in the aforementioned embodiment, the present invention is not restricted to this. In the present invention, the portions of the urging portions on the bottom surface side of the housing relative to the protruding tip portions may be formed linearly.

While the example in which the plurality of (three) urging portions 62 is spaced apart from each other has been shown in the aforementioned embodiment, the present invention is not restricted to this. The urging portions may be continuously and linearly provided.

While the example in which the end face of the convex mount 37 in the Z1 direction (protruding direction) is arranged on the bottom surface 32 side of the housing relative to the end face of the convex radiator 35 in the Z1 direction (protruding direction) has been shown in the aforementioned embodiment, the present invention is not restricted to this. In the present invention, the end face of the convex mount in the protruding direction may be arranged on the board side relative to the end face of the convex radiator in the protruding direction.

While the example in which the inner side surface 3a of the first housing 3 (housing) in the housing recess 36 includes the guide protrusions 8 that guide the urging members 6 when the urging members 6 are inserted into the housing recess 36 has been shown in the aforementioned embodiment, the present invention is not restricted to this. In the present invention, the inner side surface of the housing in the housing recess may not have the guide protrusions.

While the example in which the fastening direction in which the board 1 is fastened to the first housing 3 (housing) and the fastening direction in which the urging members 6 are fastened to the first housing 3 (housing) are the same as each other has been shown in the aforementioned embodiment, the present invention is not restricted to this. In the present invention, the fastening direction in which the board is fastened to the housing and the fastening direction in which the urging members are fastened to the housing may be different from each other.

While the example in which the power converter 100 includes the heat conduction sheets 7 has been shown in the aforementioned embodiment, the present invention is not restricted to this. In the present invention, the power converter may not include the heat conduction sheets.

What is claimed is:

1. A power converter comprising:
   a board;
   a heater element that is connected to the board and performs power conversion;
   a housing including a convex radiator that radiates heat from the heater element and protrudes toward the board, in which the board and the heater element are arranged;
   an urging member that is arranged between the board and a bottom surface of the housing and urges the heater element toward a first side surface of the convex radiator of the housing; and
   a first fastening member, wherein
   the urging member is fixed to the housing by fastening the first fastening member in a fastening direction along a direction opposite to a protruding direction of the convex radiator,
   the housing includes an inner side surface having a guide which guides a movement of the urging member along the direction opposite to the protruding direction by contacting with the urging member when the urging member is arranged between the board and the bottom surface of the housing,
   the guide protrudes in an urging direction of the urging member, and
   the urging member includes a guide groove which is engaged with the guide and is recessed in the urging direction.

2. The power converter according to claim 1, wherein
   the housing further includes a fixing portion to which the urging member is fixed; and
   the board includes a notch or an opening that exposes the fixing portion as viewed in the protruding direction of the convex radiator.

3. The power converter according to claim 2, wherein
   the fixing portion includes a convex mount that protrudes from the bottom surface of the housing toward the board; and
   an end face of the convex mount in the protruding direction is arranged on a bottom surface side of the housing relative to an end face of the convex radiator in the protruding direction.

4. The power converter according to claim 1, further comprising:
a cooling water flow path through which cooling water flows to cool a second side surface of the convex radiator on a side opposite to the first side surface.

5. The power converter according to claim 1, further comprising:
a housing recess surrounded by the first side surface of the convex radiator, an inner side surface of the housing that faces the first side surface, and a portion of the bottom surface of the housing between the first side surface and the inner side surface of the housing; wherein
the urging member is fixedly housed in the housing while being arranged in the housing recess.

6. The power converter according to claim 1, wherein the urging member includes:
a base that extends along a direction opposite to the urging direction of the urging member; and
an urging portion that protrudes from the base along the protruding direction of the convex radiator;
the board is fixed to the housing by fastening a second fastening member in the fastening direction; and
the urging member is fixed to the housing via the base by fastening the first fastening member in the fastening direction.

7. The power converter according to claim 6, wherein the heater element includes a plurality of heating elements arranged side by side on the board; and
the urging portion includes a plurality of urge-portions provided so as to correspond to arrangement positions of the plurality of heating elements, spaced apart from each other, and provided integrally with the base.

8. The power converter according to claim 6, wherein the urging portion has a tapered shape in which a width of the urging portion in a width direction orthogonal to the protruding direction of the convex radiator and a direction in which the first side surface and an inner side surface of the housing face each other decreases in the protruding direction of the convex radiator.

9. The power converter according to claim 1, further comprising:
a flexible heat conduction sheet arranged between the first side surface and the heater element; wherein
the heater element is pressed by the urging member against the first side surface of the convex radiator via the heat conduction sheet.

10. The power converter according to claim 1, wherein the guide protruding in the urging direction is formed on the inner side surface of the housing and protrudes toward the heater element, the guide having a tapered shape and a width decreasing toward the board.

11. The power converter according to claim 1, wherein the urging member includes a base, a plurality of urging portions protruding from the base toward the board to curve toward heater elements, and the guide groove formed between two of the urging members, the guide being located in the guide groove.

* * * * *